United States Patent
Huang et al.

(10) Patent No.: US 11,569,224 B2
(45) Date of Patent: Jan. 31, 2023

(54) SEMICONDUCTOR DEVICE AND OPERATION CIRCUIT

(71) Applicant: Vanguard International Semiconductor Corporation, Hsinchu (TW)

(72) Inventors: Yeh-Jen Huang, Hsinchu (TW); Wen-Hsin Lin, Jhubei (TW); Chun-Jung Chiu, Tainan (TW); Shin-Cheng Lin, Tainan (TW); Jian-Hsing Lee, Puzih (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 301 days.

(21) Appl. No.: 17/120,899

(22) Filed: Dec. 14, 2020

(65) Prior Publication Data
US 2022/0189947 A1 Jun. 16, 2022

(51) Int. Cl.
*H01L 29/772* (2006.01)
*H01L 27/02* (2006.01)
(Continued)

(52) U.S. Cl.
CPC ...... *H01L 27/0292* (2013.01); *H01L 27/0296* (2013.01); *H01L 29/2003* (2013.01); *H01L 29/41775* (2013.01)

(58) Field of Classification Search
CPC ......... H01L 29/78; H01L 27/12; H01L 27/32; H01L 27/027; H01L 27/0292; H01L 27/1214; H01L 27/127; H01L 29/78648; H01L 27/0266; H01L 27/0296; H01L 29/78645; H01L 27/02; H01L 29/41733;
(Continued)

(56) References Cited

U.S. PATENT DOCUMENTS

| 9,337,301 B2 * | 5/2016 | Palacios ................ H01L 29/812 |
| 2006/0076898 A1 * | 4/2006 | Kitazawa .................. B41J 2/45 315/169.3 |

(Continued)

FOREIGN PATENT DOCUMENTS

| TW | 201917386 A | 5/2019 |
| TW | 201929108 A | 7/2019 |
| TW | 202021126 A | 6/2020 |

OTHER PUBLICATIONS

Taiwanese Office Action for Taiwanese Application No. 109125070, dated Feb. 5, 2021.

*Primary Examiner* — Samuel Park
(74) *Attorney, Agent, or Firm* — Birch, Stewart, Kolasch & Birch, LLP

(57) ABSTRACT

A semiconductor device including a substrate, a seed layer, a buffer layer, a channel layer, a barrier layer, a gate structure, a first source/drain structure, a second source/drain structure, and a contact is provided. The seed layer is disposed on the substrate. The buffer layer is disposed on the seed layer. The channel layer is disposed on the buffer layer. The barrier layer is disposed on the channel layer. The gate structure is disposed on the barrier layer. The first and second source/drain structures are disposed on opposite sides of the gate structure. The contact contacts the first source/drain structure. The distance between the gate structure and the contact is between 0.5 micrometers and 30 micrometers.

20 Claims, 6 Drawing Sheets

(51) Int. Cl.
*H01L 29/20* (2006.01)
*H01L 29/417* (2006.01)

(58) Field of Classification Search
CPC .......... H01L 29/42384; H01L 29/2003; H01L 29/41775; H01L 29/41766; H01L 29/432; H01L 29/66462; H01L 29/7786; H01L 27/0248; H02H 9/04; G09G 3/36
See application file for complete search history.

(56) References Cited

U.S. PATENT DOCUMENTS

| | | | |
|---|---|---|---|
| 2012/0068772 A1* | 3/2012 | Murad | H01L 29/7785 |
| | | | 330/296 |
| 2012/0175680 A1* | 7/2012 | Suh | H01L 29/2003 |
| | | | 257/E29.246 |
| 2015/0028346 A1* | 1/2015 | Palacios | H01L 29/205 |
| | | | 257/76 |
| 2016/0268409 A1* | 9/2016 | Ogawa | H01L 29/7787 |
| 2019/0013398 A1* | 1/2019 | Yang | H01L 29/1075 |
| 2019/0043978 A1* | 2/2019 | Makabe | H01L 29/66462 |
| 2020/0350875 A1* | 11/2020 | Parthasarathy | H03F 3/195 |
| 2022/0045180 A1* | 2/2022 | Xiao | H01L 29/41733 |

* cited by examiner

SEMICONDUCTOR DEVICE AND OPERATION CIRCUIT

BACKGROUND OF THE DISCLOSURE

Field of the Disclosure

The disclosure relates to a semiconductor device, and more particularly to a semiconductor device that comprises a Group III-V material.

Description of the Related Art

As the semiconductor manufacturing process develops, ESD protection has become one of the most critical reliability issues for integrated circuits (IC). In particular, as semiconductor process advances into the deep sub-micron stage, scaled/down devices and thinner gate oxides are more vulnerable to ESD stress. Generally, the input/output pins on IC chips must at least sustain 2 kVolt ESD stress of high Human Body Mode (HBM) or 200V of Machine Mode. Thus, the input/output pads on IC chips usually include ESD protection devices or circuits for protecting the core circuits from ESD damage.

BRIEF SUMMARY OF THE DISCLOSURE

In accordance with an embodiment of the disclosure, a semiconductor device comprises a substrate, a seed layer, a buffer layer, a channel layer, a barrier layer, a gate structure, a first source/drain structure, a second source/drain structure, a dielectric layer, a first contact, a second contact, and a third contact. The seed layer is disposed on the substrate. The buffer layer is disposed on the seed layer. The channel layer is disposed on the buffer layer. The barrier layer is disposed on the channel layer. The gate structure is disposed on the barrier layer and comprises a first edge and a second edge. The first source/drain structure is disposed on a side of the gate structure. The second source/drain structure is disposed on another side of the gate structure. The dielectric layer covers the first source/drain structure, the second source/drain structure and the gate structure. The first contact penetrates through the dielectric layer, contacts the first source/drain structure, and comprises a third edge and a fourth edge. The second contact penetrates through the dielectric layer and contacts the gate structure. The third contact penetrates through the dielectric layer and contacts the second source/drain structure. The first edge, the second edge, the third edge, and the fourth edge are arranged in parallel. The second edge and the third edge are arranged between the first edge and the fourth edge. The first distance between the second edge and the third edge is between 0.5 micrometers and 30 micrometers.

In accordance with another embodiment of the disclosure, an operation circuit comprises a core circuit and an electrostatic discharge (ESD) protection circuit. The core circuit is coupled between the first power terminal and the second power terminal. The ESD protection circuit comprises a releasing element and a control circuit. The releasing element is coupled between the first power terminal and the second power terminal. The control circuit is coupled between the first power terminal and the second power terminal. The releasing element or the control circuit comprises a gate structure, a first source/drain structure and a first contact. The gate structure comprises a first edge and a second edge. The first contact contacts the first source/drain structure and comprises a third edge and a fourth edge. The control circuit is configured to detect ESD events. In response to an ESD event, the control circuit turns on the releasing element so that the ESD current passes from the first power terminal to the second power terminal or from the second power terminal to the first power terminal. The first edge, the second edge, the third edge, and the fourth edge are arranged in parallel. The second edge and the third edge are arranged between the first edge and the fourth edge. The first distance between the second edge and the third edge is between 0.5 micrometers and 30 micrometers.

BRIEF DESCRIPTION OF THE DRAWINGS

The disclosure can be more fully understood by referring to the following detailed description and examples with references made to the accompanying drawings, wherein.

DETAILED DESCRIPTION OF THE DISCLOSURE

Figure 1:
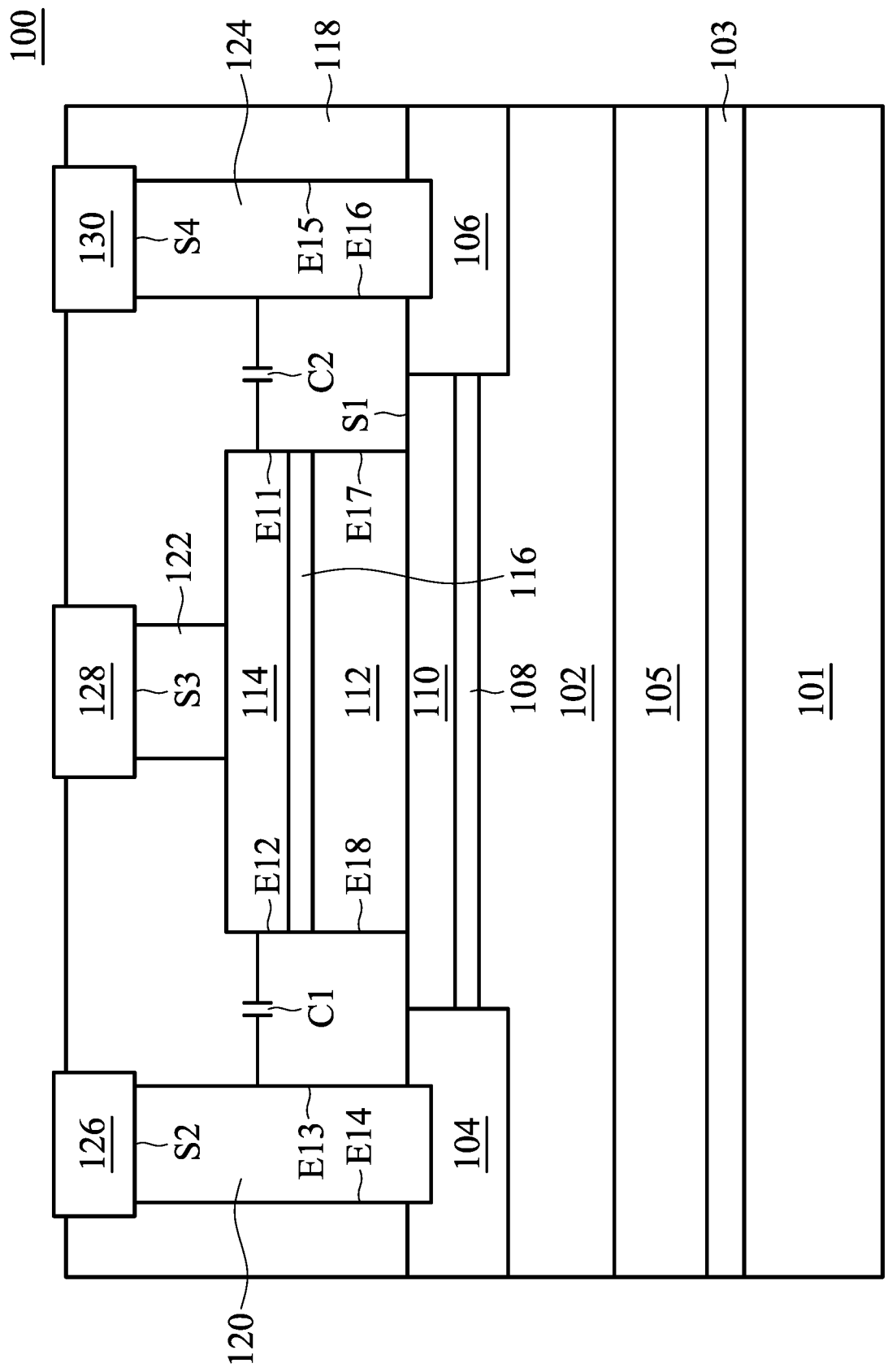
FIG. 1 is a schematic diagram of an exemplary embodiment of a semiconductor device according to various aspects of the present disclosure.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure. Additionally, the present disclosure may repeat reference numerals and/or letters in the various examples. This repetition is for the purpose of simplicity and clarity and does not in itself dictate a relationship between the various embodiments and/or configurations discussed. The terms "about", "approximately", and "substantially" used herein generally refer to a value of an error or a range within 20 percent, preferably within 10 percent, and more preferably within 5 percent, within 3 percent, within 2 percent, within 1 percent, or within 0.5 percent. If there is no specific description, the mentioned values are regarded as an approximation that is the error or the range expressed as "about", "approximate", or "substantially".

FIG. 1 is a schematic diagram of an exemplary embodiment of a semiconductor device according to various aspects of the present disclosure. The semiconductor device 100 comprises a substrate 101, a seed layer 103, a buffer layer 105, a channel layer 102, source/drain structures 104 and 106, a barrier layer 110, a capping layer 112 and a gate structure 114. In some embodiments, the substrate 101 may be or include a semiconductor-on-insulator (SOI) substrate. In some embodiments, the substrate 101 may include a ceramic substrate and a pair of blocking layers (not shown) on opposite sides of the ceramic substrate. In some embodiments, the ceramic substrate comprises ceramic materials. The ceramic materials include metal inorganic materials. In some embodiments, the ceramic substrate may be or include a silicon carbide (SiC), an aluminum nitride (AlN), a sapphire substrate, or other applicable materials. The sapphire substrate may be aluminum oxide. In some embodiment, the blocking layers on opposite sides of the ceramic substrate may include one or more insulation materials and/or other applicable materials, such as a semiconductor layer. The insulation materials may be oxide, nitride or other applicable insulation materials. The semiconductor layer may be a polysilicon layer. The blocking layers is capable of preventing the diffusion of the ceramic substrate. The blocking layers is also capable of preventing the ceramic substrate from interacting with other film layers or manufacturing machines. In some embodiment, the blocking layers can encapsulate the ceramic substrate. In such cases, the blocking layers not only covers on the top surface and the bottom surface of the ceramic substrate, but also covers the right surface and the left surface of the ceramic substrate.

The seed layer 103 is disposed on the substrate 101. The buffer layer 105 is disposed on the seed layer 103. The seed layer 103 may relieve the lattice mismatch between the substrate 101 and layers grown thereon and improve the crystalline quality. The seed layer 103 is optional. In other embodiments, the seed layer 103 is omitted. In some embodiments, the materials of the seed layer 103 may be or include aluminum nitride (AlN), aluminum gallium nitride (AlGaN), another applicable material, or a combination thereof.

The buffer layer 105 may be helpful in mitigating a strain of the channel layer 102 which is subsequently formed on the buffer layer 105, and to prevent defects from forming in the overlying channel layer 102. In some embodiments, as mentioned above, the buffer layer 105 may be formed directly on the substrate 101 without the seed layer 103, to simplify the steps of the process, and the performance may be improved as well. In some embodiments, the materials of the buffer layer 105 may include a Group III-V compound semiconductor material, such as a Group III nitride. For example, the materials of the buffer layer 105 may include gallium nitride (GaN), aluminum nitride (AlN), aluminum gallium nitride (AlGaN), aluminum indium nitride (AlInN), another applicable material, or a combination thereof.

The channel layer 102 is disposed on the buffer layer 105 and comprises a Group III-V compound semiconductor material, such as a Group III nitride. For example, the materials of the channel layer 102 may be or include gallium nitride (GaN), aluminum nitride (AlN), aluminum gallium nitride (AlGaN), aluminum indium nitride (AlInN), another applicable material, or a combination thereof. In some embodiments, the channel layer 102 may be formed by a deposition process, such as metal organic chemical vapor deposition (MOCVD), atomic layer deposition (ALD), molecular beam epitaxy (MBE), liquid phase epitaxy (LPE), another applicable process, or a combination thereof.

The source/drain structures 104 and 106 are formed in the channel layer 102. In some embodiments, the materials of the source/drain structures 104 and 106 may be or include a conductive material, such as a metal material, a metal silicide, a semiconductor material, or a combination thereof. For example, the metal material may be gold (Au), nickel (Ni), platinum (Pt), palladium (Pd), iridium (Ir), titanium (Ti), chromium (Cr), tungsten (W), aluminum (Al), copper (Cu), TiN, the like, a combination thereof, or multilayers thereof. The semiconductor material may be a polysilicon or a poly-germanium.

The barrier layer 110 is disposed in the channel layer 102 and between the source/drain structures 104 and 106. The materials of the barrier layer 110 may include one or more Group III-V compound semiconductor materials, such as a Group III nitride. For example, the barrier layer 110 may be or include GaN, AlGaN, AlInN, InGaN, InAlGaN, another applicable material, or a combination thereof. In some embodiments, the barrier layer 110 may be formed by a deposition process, such as MOCVD, ALD, MBE, LPE, another applicable process, or a combination thereof.

Since the materials of the channel layer 102 and the barrier layer 110 are different, a heterogeneous interface is formed between the channel layer 102 and the barrier layer 110. Due to the band gap of the heterogeneous materials, a two-dimensional electron gas (2DEG) 108 is formed on the heterogeneous interface. In one embodiment, the 2DEG 108 is provided as conductive carriers of the semiconductor device 100.

The capping layer 112 is disposed on the channel layer 102 and covers the barrier layer 110. The capping layer 112 is utilized to inhibit the generation of the 2DEG 108 to achieve a normally-off status for the semiconductor device 100. In other embodiments, the capping layer 112 consumes the 2DEG 108 under the capping layer 112 and does not cut off the conductive path provided by the 2DEG 108 to increase the breakdown voltage and the reliability of the semiconductor device 110. In this embodiment, the capping layer 112 has edges E17 and E18. The edges E17 and E18 are arranged in parallel and vertical to the surface S1 of the barrier layer 110. In this case, the edge E17 does not contact the source/drain structure 106, and the edge E18 does not contact the source/drain structure 104. In some embodiments, the material of the capping layer 112 is GaN with a p-type or an n-type dopant.

The gate structure 114 is disposed on the capping layer 112 and has edges E11 and E12. The edge E11 is parallel with the edge E12 and vertical to the surface S1 of the barrier layer 110. In this embodiment, the edge E11 is aligned with the edge E17, and the edge E12 is aligned with the edge E18. In some embodiments, the material of the gate structure 114 may be or include a conductive material, such as a metal material, a metal silicide, a semiconductor material, or a combination thereof. For example, the metal material may be gold (Au), nickel (Ni), platinum (Pt), palladium (Pd), iridium (Ir), titanium (Ti), chromium (Cr), tungsten (W), aluminum (Al), copper (Cu), TiN, the like, a combination thereof, or multilayers thereof. The semiconductor material may be a polysilicon or a poly-germanium.

In other embodiments, a contact layer 116 is formed between the gate structure 114 and the capping layer 112. For example, the contact layer 116 may include a refractory metal material, such as titanium, zirconium, hafnium, vanadium, niobium, tantalum, chrome, molybdenum, tungsten, manganese, technetium, rhenium, ruthenium, osmium, rhodium, iridium, another applicable material, or a combination thereof. In one embodiment, the material of the contact layer 116 is TiN. In other embodiments, the contact layer 116 can be omitted to simplify the steps of the process.

The dielectric layer 118 covers the source/drain structures 104 and 106, the barrier layer 110, the capping layer 112, and the gate structure 114. The dielectric layer 118 may comprise or be one or more layers of silicon dioxide, a low-k dielectric material, such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), carbon doped silicon oxide, Spin-On-Glass, Spin-On-Polymers, silicon carbon material, a compound thereof, a composite thereof, the like, or a combination thereof.

The contacts 120, 122 and 124 penetrate through the dielectric layer 118. In this embodiment, the contact 120 contacts the source/drain structure 104. The contact 122 contacts the gate structure 114. The contact 124 contacts the source/drain structure 106. In one embodiment, the projection area of the source/drain structure 104 on the channel layer 102 is larger than the projection area of the contact 120 on the channel layer 102. In such cases, the projection area of the gate structure 114 on the channel layer 102 is larger than the projection area of the contact 122 on the channel layer 102. Additionally, the projection area of the source/drain structure 106 on the channel layer 102 is larger than the projection area of the contact 124 on the channel layer 102. In some embodiments, the materials of the contacts 120, 122 and 124 may be metal materials, such as gold (Au), nickel (Ni), platinum (Pt), palladium (Pd), iridium (Ir), titanium (Ti), chromium (Cr), tungsten (W), aluminum (Al), copper (Cu), TiN, the like, a combination thereof, or multilayers thereof.

In one embodiment, the contact 120 has edges E13 and E14, and a surface S2. The contact 122 has a surface S3. The contact 124 has edges E15 and E16, and a surface S4. The surfaces S1 and S2 to S4 are arranged in parallel and vertical to the edges E11 to E18. In this embodiment, the surface S2 is aligned with the surfaces S3 and S4.

Additionally, the edges E13 to E16 are arranged in parallel and vertical to the surface S1 of the barrier layer 110. As shown in FIG. 1, the edge E16 is located between the edges E11 and E15. The edge E11 is located between the edges E12 and E16. In one embodiment, the distance between the edges E11 and E16 is between 0.5 micrometers and 30 micrometers. Furthermore, the edge E12 is located between the edges E11 and E13, and the edge E13 is located between the edges E12 and E14. The distance between the edges E12 and E13 is about 0.5 micrometers to 30 micrometers. In some embodiments, the distance between the edges E12 and E13 is equal to the distance between the edges E11 and E16. In other embodiments, since the edge E11 is aligned with the edge E17, the distance between the edges E17 and E16 is also equal to the distance between the edges E11 and E16. Similarly, the edge E12 is aligned with the edge E18 so that the distance between the edges E13 and E18 is also equal to the distance between the edges E13 and E12.

A capacitor C2 is formed between the gate structure 114 and the contact 124. The capacitance of the capacitor C2 relates to the distance between the edges E11 and E16. For example, with increase of distance between the edges E11 and E16, the capacitance of the capacitor C2 is increased. With decrease of distance between the edges E11 and E16, the capacitance of the capacitor C2 is reduced. In one embodiment, the distance between the edges E11 and E16 is about 0.75 micrometer (um). Furthermore, a capacitor C1 is formed between the gate structure 114 and the contact 120. The capacitance of the capacitor C1 relates to the distance between the edges E12 and E13. In one embodiment, the distance between the edges E12 and E13 is about 0.75 micrometer (um). Since the feature of the capacitor C1 is the same as the feature of the capacitor C2, the description of the feature of the capacitor C1 is omitted.

In other embodiment, the capacitances of the capacitors C1 and C2 may be calculated according to Miller ratio. The calculated result defines the distance between the edges E12 and E13 and the distance between the edges E11 and E16. The relationship between the Miller rate and the capacitances of the capacitors C1 and C2 is as follows:

$$\text{Miller rate} = \frac{Cgd}{Cgs + Cgd},$$

wherein Cgd represents the capacitance of the capacitor C2, and Cgs represents the capacitance of the capacitor C1.

In one embodiment, the Miller rate is approximately between 0.3 and 0.55. In other embodiments, the semiconductor 100 further comprises electrodes 126, 128 and 130. The electrode 126 is configured to electrically connect to the contact 120. The electrode 128 is configured to electrically connect to the contact 122. The electrode 130 is configured to electrically connect to the contact 124. In one embodiment, the electrode 126 does not cover the gate structure 114. In another embodiment, the projection area of the electrode 126 on the channel layer 102 is outside the projection area of the electrode 128 on the channel layer 102. In other words, the projection area of the electrode 126 on the channel layer 102 does not overlap the projection area of the electrode 128 on the channel layer 102.

In some embodiment, the semiconductor device 100 is used as an electrostatic discharge (ESD) protection element which is capable of withstanding instant high voltage. For example, when the voltage of the electrode 128 is enough, the semiconductor device 100 is turned on. Therefore, an ESD current passes from the electrode 130, through the semiconductor device 100 and into the electrode 126. In another embodiment, when the semiconductor device 100 is turned on, the ESD current passes from the electrode 126, through the semiconductor device 100, and into the electrode 130. In this embodiment, due the high electronic mobility in the 2DEG 108, the semiconductor device 100 can serve as a high electron mobility transistor (HEMT). In such cases, the electrode 126 may be provided as a source or a drain of the HEMT, the electrode 128 may be provided as a gate of the HEMT, and the electrode 130 may be provided as a drain or a source. For example, when the electrode 126 serves as a source of the HEMT, the electrode 130 serves as a drain of the HEMT. When the electrode 126 serves as a drain of the HEMT, the electrode 130 serves as a source of the HEMT.

In this embodiment, since the contact 120 and the electrode 126 does not cover the gate structure 114 via any field plate, the capacitance of the capacitor C1 between the source/drain structure 104 and the gate structure 114 can be reduced. Therefore, the trigger voltage of the semiconductor device 100 can be reduced and the ESD tolerance of the semiconductor device 100 is increased. For example, when the ESD voltage is higher than the trigger voltage of the semiconductor device 100, the semiconductor device 100 is turned on to release the ESD current. Additionally, when the two edges of the gate structure 114 are aligned with the two edges of the capping layer 112, the capacitance of the parasitic capacitor between the gate and the 2DEG 108 is reduced.

Figure 2:
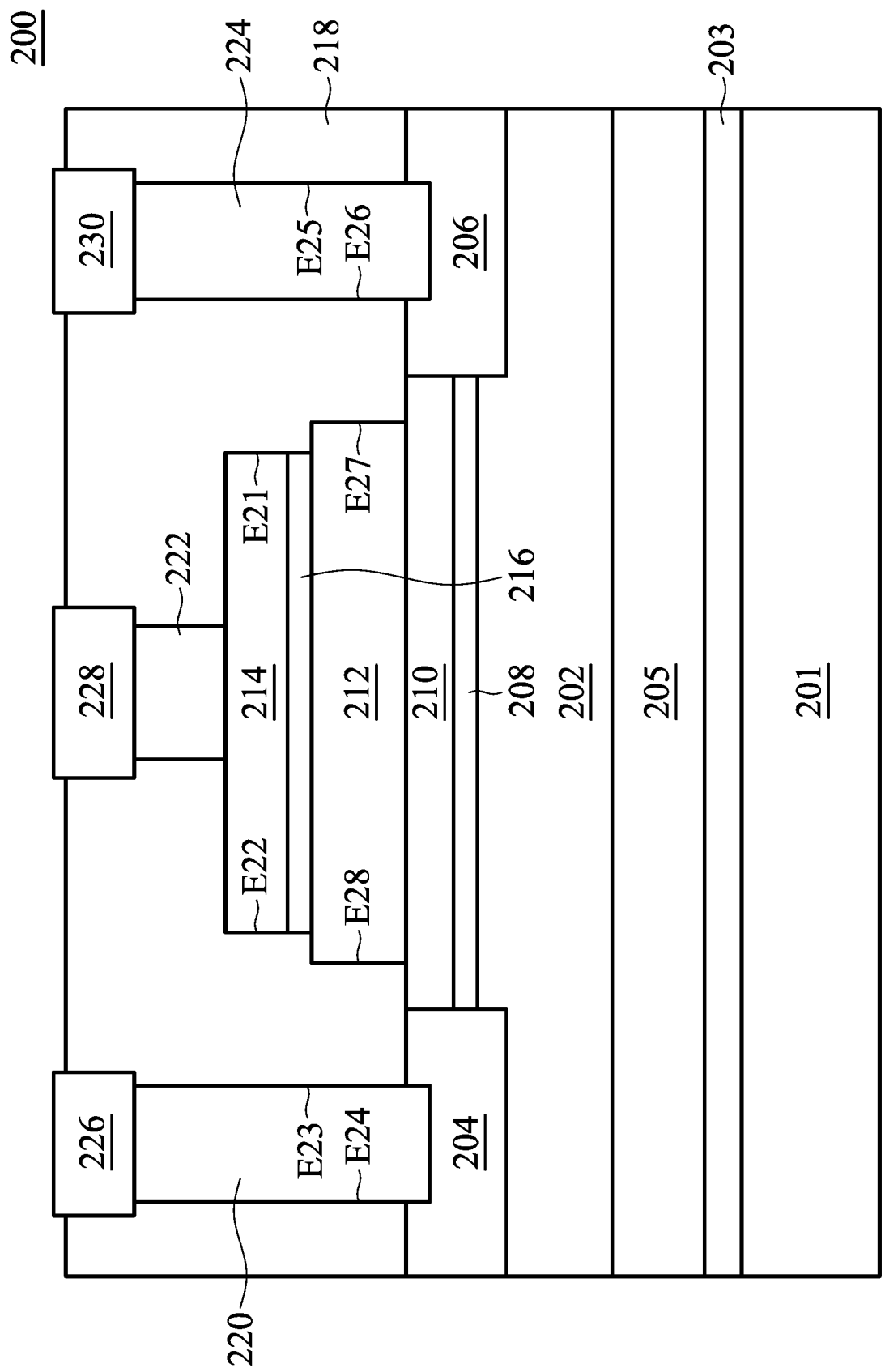
FIG. 2 is a schematic diagram of another exemplary embodiment of the semiconductor device according to various aspects of the present disclosure.

FIG. 2 is a schematic diagram of another exemplary embodiment of the semiconductor device according to various aspects of the present disclosure. FIG. 2 is similar to FIG. 1 with the exception that the edge E27 of the capping layer 212 of FIG. 2 does not align with the edge E21 of the gate structure 214, and the edge E28 of the capping layer 212 does not align with the edge E22 of the gate structure 214. Since the characteristics of the channel layer 202, the source/drain structures 204 and 206, the barrier layer 210, the capping layer 212, the gate structure 214, the dielectric layer 218, the contacts 220, 222, 224, and the electrodes 226, 228, and 230 shown in FIG. 2 are similar to the characteristics of the channel layer 102, the source/drain structures 104 and 106, the barrier layer 110, the capping layer 112, the gate structure 114, the dielectric layer 118, the contacts 120, 122, and 124, and the electrodes 126, 128, and 130 shown in FIG. 1, the related description is omitted here.

In this embodiment, the distance between the edge E27 of the capping layer 212 and the edge E26 of the contact 224 is less than the distance between the edge E21 of the gate structure 214 and the edge E26 of the contact 224. Additionally, the distance between the edge E28 of the capping layer 212 and the edge E23 of the contact 220 is less than the distance between the edge E22 of the gate structure 214 and the edge E23 of the contact 220.

Figure 3A:
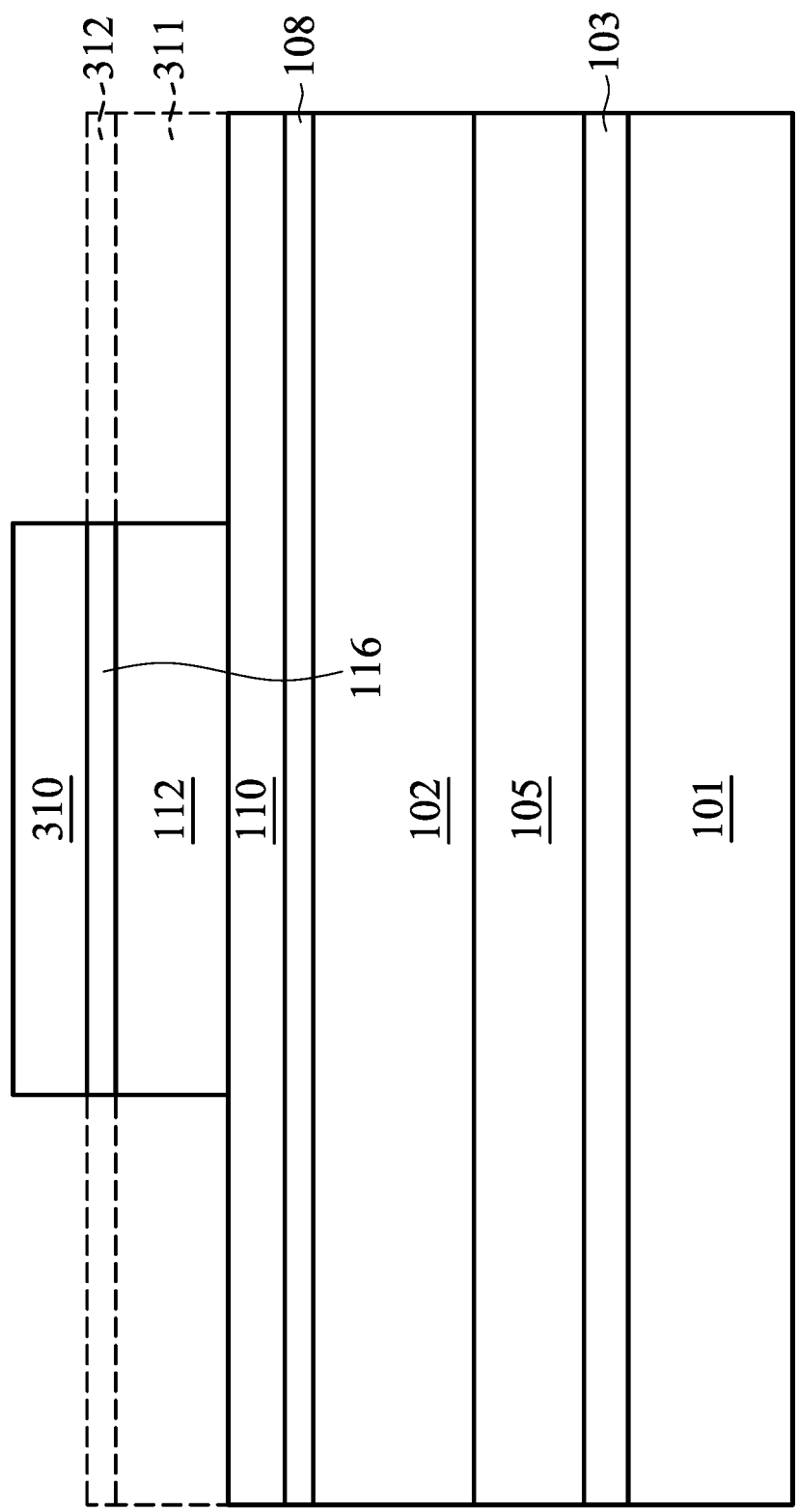
FIGS. 3A to 3C are schematic diagrams of an exemplary embodiment for forming the semiconductor device of FIG. 1 according to various aspects of the present disclosure.
Figure 3B:
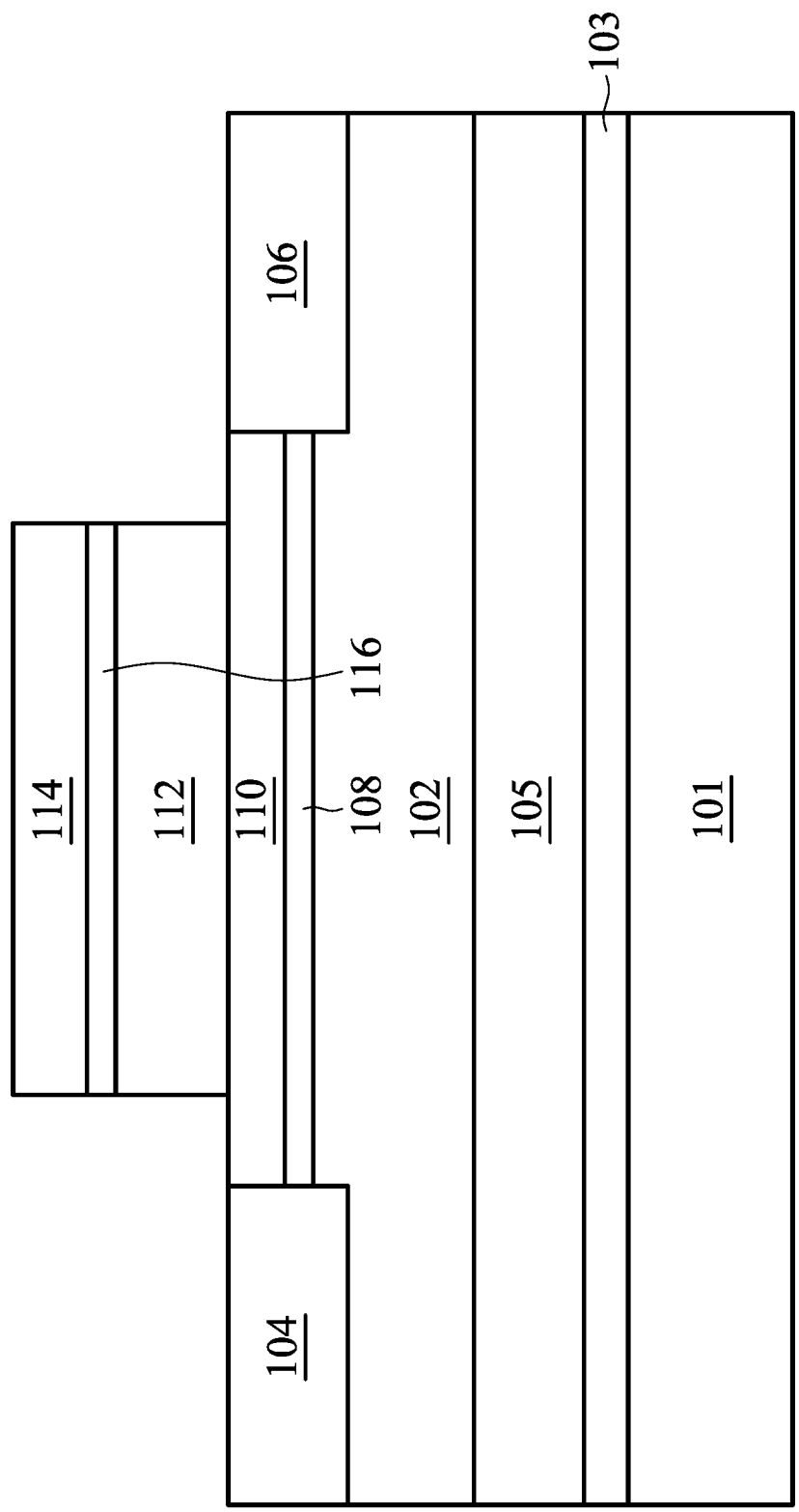
Figure 3C:
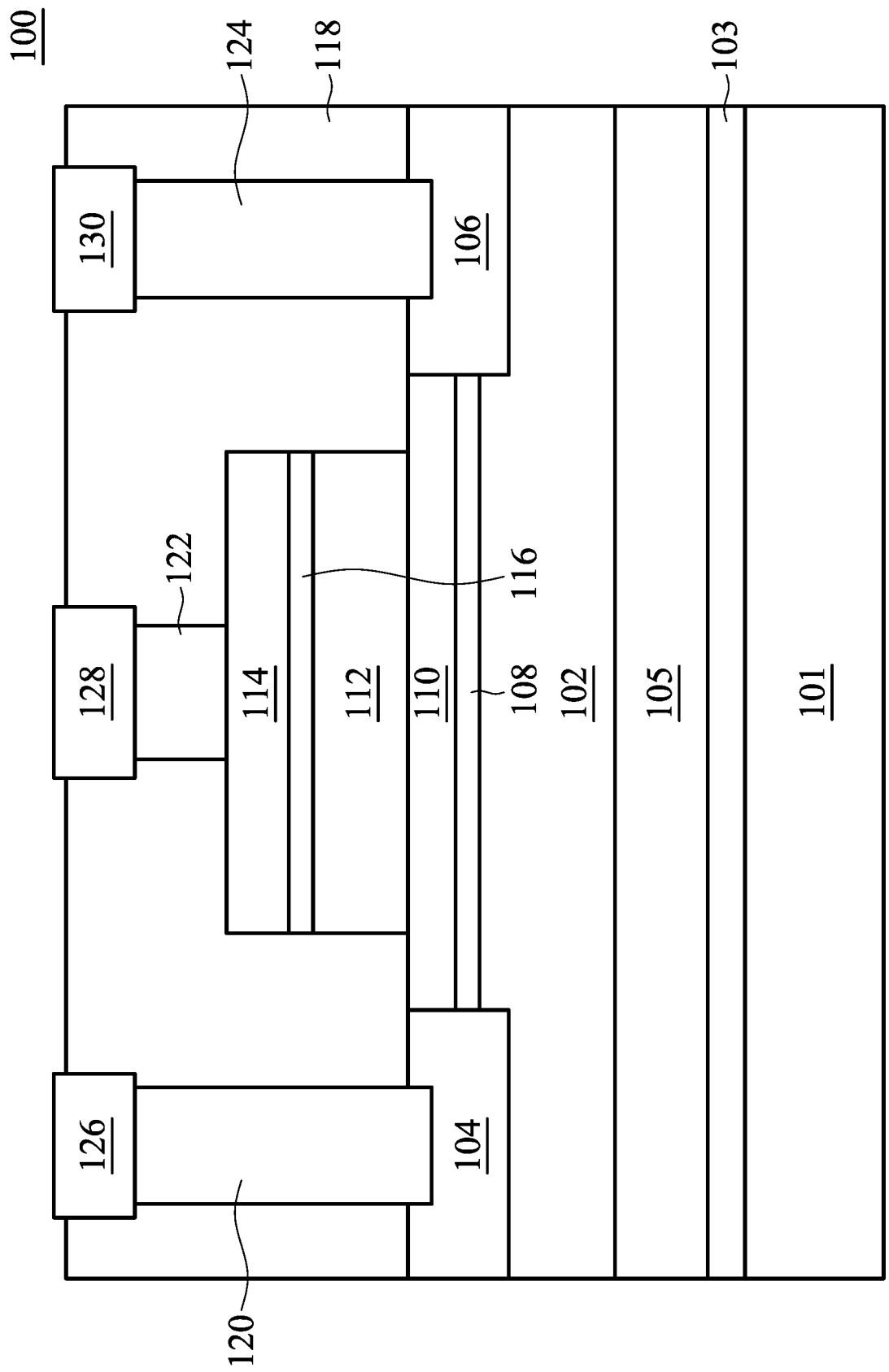

FIGS. 3A to 3C are schematic diagrams of an exemplary embodiment for forming the semiconductor device of FIG. 1 according to various aspects of the present disclosure. First, refer to FIG. 3A, the substrate 101 is provided. Then, the seed layer 103 is formed on the substrate 101. The buffer layer 105 is formed on the seed layer 103. The channel layer 102 is formed on the buffer layer 105. The barrier layer 110 is formed on the channel layer 102. In some embodiments, each of the seed layer 103, the buffer layer 105, the channel layer 102 and the barrier layer 110 may be formed by a deposition process, such as metal organic chemical vapor deposition (MOCVD), atomic layer deposition (ALD), molecular beam epitaxy (MBE), liquid phase epitaxy (LPE), another applicable process, or a combination thereof.

Since the material of the channel layer 102 is different from the material of the barrier layer 110, a heterogeneous interface is formed between the channel layer 102 and the barrier layer 110. The 2DEG 108 is formed on the a heterogeneous interface due to the bandgap of the heterogeneous materials. The 2DEG 108 is utilized as conductive carriers of a HEMT.

Next, the capping layer 112 and the contact layer 116 are formed on the barrier layer 110. In some embodiments, each of the capping layer 112 and the contact layer 116 may be formed by a deposition process and a patterning process. For example, the deposition process may be used to form a compound semiconductor material layers 311 and 312 on the barrier layer 110. In some embodiments, the patterning process includes forming a patterned mask layer 310 on the compound semiconductor material layer 312, and then etching a portion of the compound semiconductor material layers 311 and 312 that is not covered by the patterned mask layer 310, thereby forming the capping layer 112 and the contact layer 116. In some embodiments, the deposition process may include metal organic chemical vapor deposition (MOCVD), atomic layer deposition (ALD), molecular beam epitaxy (MBE), liquid phase epitaxy (LPE), another applicable process, or a combination thereof.

In some embodiments, the patterned mask layer 310 may be a photoresist, such as a positive photoresist or a negative photoresist. In other embodiments, the patterned mask layer 310 may be a hard mask, such as silicon oxide, silicon nitride, silicon oxynitride, silicon carbide, silicon carbon nitride, the like, or a combination thereof. In some embodiments, the patterned mask layer 310 may be formed by spin-on coating, physical vapor deposition (PVD), chemical vapor deposition (CVD), another applicable process, or a combination thereof.

In some embodiments, the compound semiconductor material layer may be etched by using a dry etch process, a wet etch process, or a combination thereof. For example, the compound semiconductor material layer may be etched by reactive ion etching (RIE), inductively/coupled plasma (ICP) etching, neutral beam etching (NBE), electron cyclotron resonance (ERC) etching, another applicable process, or a combination thereof.

Referring to FIG. 3B, the gate structure 114 is formed on the contact layer 116. In some embodiments, the steps of forming the gate structure 114 may include globally depositing a conductive material layer (not shown) for the gate structure 114 over the channel layer 102, and performing a patterning process on the conductive material layer to form the gate structure 114 on the contact layer 116. The deposition process for forming the conductive material layer may be atomic layer deposition (ALD), chemical vapor deposition (CVD), physical vapor deposition (PVD) such as sputtering, a combination thereof, or the like.

Then, the source/drain structures 104 and 106 are disposed on opposite sides of the gate structure 114. The source/drain structures 104 and 106 extend through the barrier layer 110 and the 2DEG 108. In some embodiments, the source/drain structures 104 and 106 may be formed by performing a patterning process to recess the barrier layer 110, the 2DEG 108 and a portion of the channel layer 102 on opposite sides of the gate structure 114 to form a pair of recesses, wherein the pair of the recesses penetrates through the barrier layer 110 and extends to the channel layer 102. Then a conductive material is deposited over the pair of recesses, and the patterning process is performed on the deposited conductive material to form the source/drain structures 104 and 106 at a predetermined location. In other embodiments, the depths of the source/drain structures 104 and 106 may be adjusted depending on the required characteristics of the actual product. Additionally, the deposition process and the materials of the source/drain structures 104 and 106 may be similar to the deposition process and the materials of the gate structure 114, and therefore are not repeated here.

The source/drain structures 104 and 106, and the gate structure 114 are formed in the different steps as described herein, but the present disclosure is not limited thereto. For example, recesses for the source/drain structures 104 and 106 may be formed before the formation of the gate structure 114, and then a deposition process and a patterning process are performed to form the source/drain structures 104 and 106, and the gate structure 114 at the same time. In some embodiments, the source/drain structures 104 and 106, and the gate structure 114 may be formed independently by the same or different processes and materials. Furthermore, the shape of the source/drain structures 104 and 106, and the gate structure 114 are not limited to the vertical sidewalls as illustrated in the figures, and may have inclined sidewalls or another shape.

Referring to FIG. 3C, the dielectric layer 118 is formed on the source/drain structures 104 and 106, the gate structure 114, and the barrier layer 110. The dielectric layer 118 covers the source/drain structures 104 and 106, the gate structure 114, and the barrier layer 110. The contact 120 is formed in the dielectric layer 118 to connect the source/drain structure 104. The contact 122 is formed in the dielectric layer 118 to connect the gate structure 114. The contact 130 is formed in the dielectric layer 118 to connect the source/drain structure 106. In some embodiment, the dielectric layer 118 may be deposited by any acceptable process, such as chemical vapor deposition (CVD), plasma enhanced CVD (PECVD), another applicable process, or a combination thereof.

The steps of forming the contacts 126, 128, and 130 may include forming openings (not shown) which correspond to the source/drain structure 104, the gate structure 114, and the source/drain structure 106 and penetrate through the dielectric layer 118 to respectively expose the source/drain structure 104, the gate structure 114, and the source/drain structure 106 by using a patterning process, and depositing a metal material (not shown) over the dielectric layer 118 to fill the openings.

Then, the electrodes 126, 128, and 130 are formed on the contacts 126, 128, and 130. In some embodiments, a metal material (not shown) is deposited over the contacts 126, 128, and 130 and a planarization process is performed to remove portions of the metal material over the dielectric layer 118, thereby forming the electrodes 126, 128, and 130.

In this embodiment, the source/drain structures 104 and 106 do not electrically connect to any field plate to avoid forming capacitors between the gate structure and other metal layers. Furthermore, the distances between the gate structure 114 and the contacts 120 and 124 are controlled to adjust the trigger voltage of the semiconductor device 100 and optimize the second breakdown current of the semiconductor device 100 so that the ESD protection capability of the semiconductor device 100 is increased.

Figure 4:
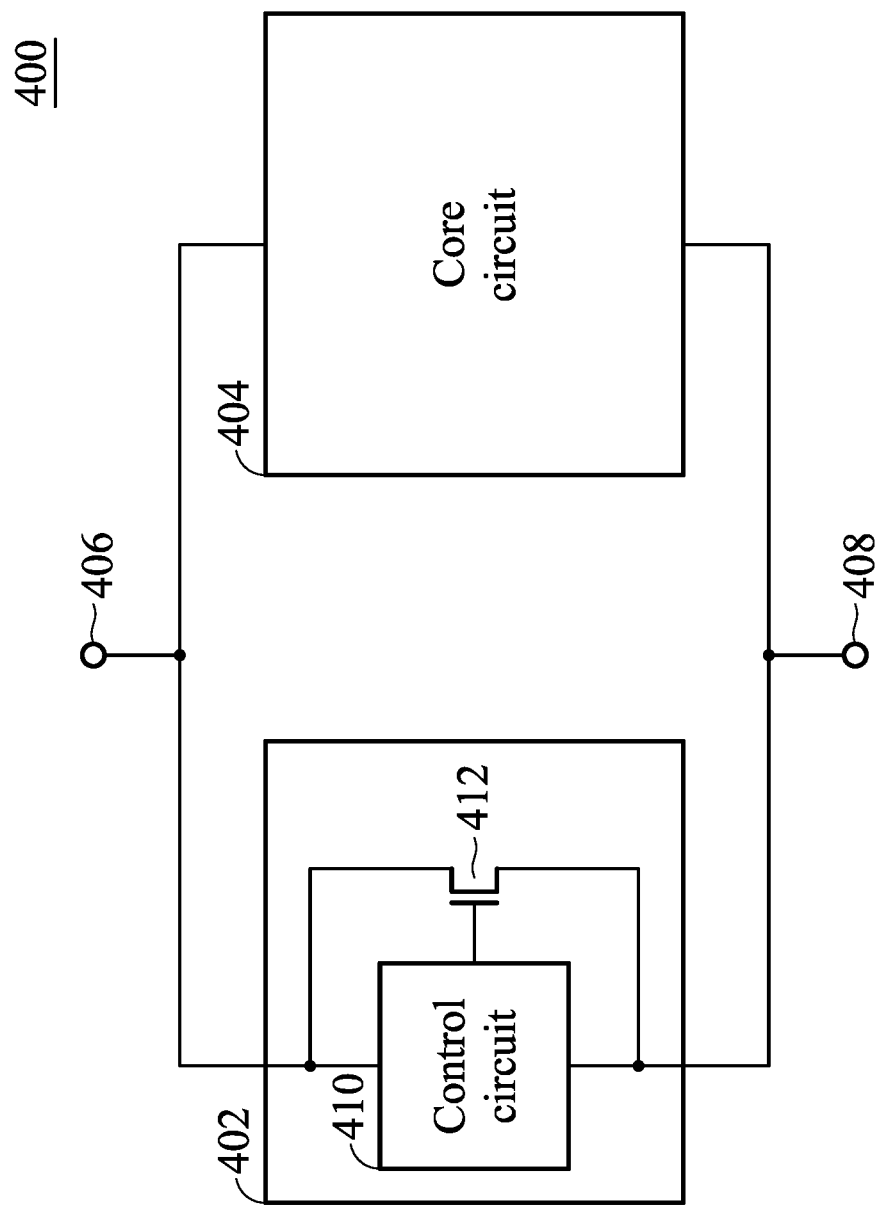
FIG. 4 is a schematic diagram of an exemplary embodiment for applying the semiconductor device of FIG. 1 according to various aspects of the present disclosure.

FIG. 4 is a schematic diagram of an exemplary embodiment for applying the semiconductor device of FIG. 1 according to various aspects of the present disclosure. In this embodiment, the operation circuit 400 comprises an ESD protection circuit 402 and a core circuit 404. The ESD protection circuit 402 and the core circuit 404 are coupled between the power terminals 402 and 404. When an ESD event occurs, the operation circuit 400 enters a protection mode. In the protection mode, the ESD protection circuit 402 is working to release an ESD current from the power terminal 406 to the power terminal 408 or from the power terminal 408 to the power terminal 406. Therefore, there is no ESD current to pass through the core circuit 404. At this time, the core circuit 404 stops working. When no ESD event occurs, the operation circuit 400 enters a normal mode. In the normal mode, the ESD protection circuit 402 stops working. At this time, the core circuit 404 operates according to the voltages of the power terminals 406 and 408. In the normal mode, the power terminal 406 receives a first operation voltage, such as 5V, and the power terminal 408 receives a second operation voltage, such as 0V. In one embodiment, the core circuit 404 comprises a silicon MOS transistor, LDMOS (lateral double-diffused metal oxide semiconductor) transistor or a HEMT (high-electron-mobility transistor). In one embodiment, the HEMT is GaN HEMT, and the HEMT may comprise a field plate, but it is not limited to the disclosure.

In one embodiment, the ESD protection circuit 402 comprises a control circuit 410 and a releasing element 412. The control circuit 410 is configured to determine whether an ESD event occurs. When an ESD event occurs at one of the power terminals 406 and 408 and another of the power terminals 406 and 408 is coupled to ground, the control circuit 410 turns on the releasing element 412. Therefore, an ESD current passes from the power terminal 406, through the releasing element 412 and to the power terminal 408 or passes from the power terminal 408, through the releasing element 412 and to the power terminal 406. Since no ESD current flows to the core circuit 404, the elements in the core circuit 404 are not damaged by the ESD current.

In this embodiment, the semiconductor device 100 of FIG. 1 or the semiconductor device 200 of FIG. 2 can serve as the releasing element 412. Taking the semiconductor device 100 as an example, the electrode 126 may be coupled to the power terminal 406 via a track (not shown), the electrode 130 may be coupled to the power terminal 408 via another track (not shown), and the electrode 128 may be coupled to the control circuit 410 via another track (not shown). Since there is no field plate in the semiconductor device 100, the parasitism capacitors between the gate and the source and between the gate and the drain can be reduced. In one embodiment, the control circuit 410 and the releasing element 412 may include the semiconductor device 100 of FIG. 1 and the semiconductor device 200 of FIG. 2, respectively.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A semiconductor device, comprising:
a substrate;
a seed layer disposed on the substrate;
a buffer layer disposed on the seed layer;
a channel layer disposed on the buffer layer;
a barrier layer disposed on the channel layer;
a gate structure disposed on the barrier layer and comprising a first edge and a second edge;
a first source/drain structure disposed on a side of the barrier layer;
a dielectric layer covering the first source/drain structure and the gate structure; and
a first contact penetrating through the dielectric layer, contacting the first source/drain structure, and comprising a third edge and a fourth edge;
wherein the first edge, the second edge, the third edge, and the fourth edge are arranged in parallel, and the second edge and the third edge are arranged between the first edge and the fourth edge, and
wherein a first distance between the second edge and the third edge is between 0.5 micrometers and 30 micrometers.

2. The semiconductor device as claimed in claim 1, further comprising:
a second source/drain structure disposed on another side of the barrier layer;
a second contact penetrating through the dielectric layer and contacting the gate structure; and
a third contact penetrating through the dielectric layer and contacting the second source/drain structure.

3. The semiconductor device as claimed in claim 2, wherein the third contact comprises a fifth edge and a sixth edge,
wherein:
the first edge, the fifth edge, and the sixth edge are arranged in parallel, and the first edge and the sixth edge are between the second edge and the fifth edge, and a second distance between the first edge and the sixth edge is between 0.5 micrometers and 30 micrometers.

4. The semiconductor device as claimed in claim 3, wherein the first distance is equal to the second distance.

5. The semiconductor device as claimed in claim 3, further comprising:
a capping layer disposed between the barrier layer and the gate structure and comprising a seventh edge and an eighth edge,
wherein:
the third edge, the seventh edge, and the eighth edge are arranged in parallel, the seventh edge and the eighth edge are between the third edge and the sixth edge, and
a third distance between the third edge and the eighth edge is equal to the first distance, and a fourth distance between the seventh edge and the sixth edge is equal to the second distance.

6. The semiconductor device as claimed in claim 3, further comprising:
a capping layer disposed between the barrier layer and the gate structure and comprising a seventh edge and an eighth edge,
wherein:
the third edge, the seventh edge, and the eighth edge are arranged in parallel, and the seventh edge and the eighth edge are between the third edge and the sixth edge, and
a third distance between the third edge and the eighth edge is less than the first distance, and a fourth distance between the sixth edge and the seventh edge is less than the second distance.

7. The semiconductor device as claimed in claim 2, further comprising:
a first electrode electrically connected to the first contact;
a second electrode electrically connected to the second contact; and
a third electrode electrically connected to the third contact,
wherein a projection area of the first electrode on the channel layer is outside a projection area of the second electrode on the channel layer.

8. The semiconductor device as claimed in claim 7, wherein the first electrode does not cover the gate structure.

9. The semiconductor device as claimed in claim 2, wherein a first capacitor is formed between the gate structure and the first contact, a second capacitor is formed between the gate structure and the third contact, and a result that is generated from the capacitance of the second capacitor divided by a sum of the capacitances of the first and second capacitors is between 0.3 and 0.55.

10. An operation circuit comprising:
a core circuit coupled between a first power terminal and a second power terminal; and
an electrostatic discharge (ESD) protection circuit comprising:
a releasing element coupled between the first power terminal and the second power terminal; and
a control circuit coupled between the first power terminal and the second power terminal,
wherein the releasing element or the control circuit comprises the semiconductor device as claimed in claim 1.

11. The operation circuit as claimed in claim 10, wherein in response to the releasing element being turned on, the core circuit stops operating.

12. The operation circuit as claimed in claim 11, wherein in response to the first power terminal receiving a first operation voltage and the second power terminal receiving a second operation voltage, the control circuit turns off the releasing element and the core circuit operates according to the first operation voltage and the second operation voltage.

13. The operation circuit as claimed in claim 10, wherein the releasing element or the control circuit further comprises:
a second source/drain structure disposed on another side of the barrier layer;
a second contact contacting the gate structure; and
a third contact contacting the second source/drain structure and comprising a fifth edge and a sixth edge,
wherein the first edge, the fifth edge, and the sixth edge are arranged in parallel, the first edge and the sixth edge are between the second edge and the fifth edge, and a second distance between the first edge and the sixth edge is between 0.5 micrometers and 30 micrometers.

14. The operation circuit as claimed in claim 13, wherein the first distance is equal to the second distance.

15. The operation circuit as claimed in claim 13, wherein the releasing element further comprises:
a capping layer disposed under the gate structure and comprising a seventh edge and an eighth edge,
wherein:
the third edge, the seventh edge, and the eighth edge are arranged in parallel, the seventh edge and the eighth edge are between the third edge and the sixth edge, and
a third distance between the third edge and the eighth edge is equal to the first distance, and a fourth distance between the seventh edge and the sixth edge is equal to the second distance.

16. The operation circuit as claimed in claim 13, wherein the releasing element further comprises:
a capping layer disposed between the barrier layer and the gate structure and comprising a seventh edge and an eighth edge,
wherein:
the third edge, the seventh edge, and the eighth edge are arranged in parallel, and the seventh edge and the eighth edge are between the third edge and the sixth edge, and
a third distance between the third edge and the eighth edge is less than the first distance, and a fourth distance between the sixth edge and the seventh edge is less than the second distance.

17. The operation circuit as claimed in claim 13, wherein a first capacitor is formed between the gate structure and the first contact, a second capacitor is formed between the gate structure and the third contact, and a result that is generated from the capacitance of the second capacitor divided by a sum of the capacitances of the first and second capacitors is between 0.3 and 0.55.

18. The operation circuit as claimed in claim 13, wherein the first contact is electronically connected to the first power terminal, the second contact is electronically connected to the control circuit, and the third contact is electronically connected to the second power terminal.

19. The operation circuit as claimed in claim 10, wherein the control circuit is configured to detect whether an ESD event occurs, in response to the ESD event occurring, the control circuit turns on the releasing element so that ESD current passes from the first power terminal to the second power terminal or from the second power terminal to the first power terminal.

20. The operation circuit as claimed in claim 10, wherein the core circuit comprises a silicon MOS transistor, a LDMOS transistor or a HEMT.

\* \* \* \* \*